US008729684B2

(12) United States Patent  
Park et al.

(10) Patent No.: US 8,729,684 B2
(45) Date of Patent: May 20, 2014

(54) INTERPOSER CHIP, MULTI-CHIP PACKAGE INCLUDING THE INTERPOSER CHIP, AND METHOD OF MANUFACTURING THE SAME

(75) Inventors: Yeong-Lyeol Park, Yongin-si (KR); Sung-Dong Cho, Hwaseong-si (KR); Sin-Woo Kang, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 364 days.

(21) Appl. No.: 13/215,425

(22) Filed: Aug. 23, 2011

(65) Prior Publication Data

US 2012/0051019 A1    Mar. 1, 2012

(30) Foreign Application Priority Data

Aug. 24, 2010  (KR) .................. 10-2010-0081902

(51) Int. Cl.
*H01L 23/02* (2006.01)
(52) U.S. Cl.
USPC .... 257/678; 257/686; 257/691; 257/E21.499; 257/E23.001; 257/E25.001; 257/E25.006
(58) Field of Classification Search
USPC .......... 257/678, 686, 691, E21.499, E23.001, 257/E25.001, E25.006
See application file for complete search history.

(56) References Cited

U.S. PATENT DOCUMENTS

| 2006/0227587 A1* | 10/2006 | Nakamura et al. ............... 365/63 |
| 2007/0117267 A1* | 5/2007 | Karnezos ....................... 438/109 |
| 2007/0235850 A1* | 10/2007 | Gerber et al. .................. 257/678 |
| 2010/0133704 A1* | 6/2010 | Marimuthu et al. ........... 257/778 |

FOREIGN PATENT DOCUMENTS

| JP | 06-043210 | 2/1994 |
| JP | 2002-228725 | 8/2002 |
| JP | 2003-139820 | 5/2003 |
| JP | 2003-185710 | 7/2003 |

* cited by examiner

*Primary Examiner* — Timor Karimy
(74) *Attorney, Agent, or Firm* — Muir Patent Consulting, PLLC

(57) ABSTRACT

An interposer chip may include a substrate, a plurality of upper terminals, a plurality of lower terminals, a first conductive pattern that electrically connects the first upper terminal to a first set of one or more lower terminals, a second conductive pattern that electrically connects the second upper terminal to a second set of one or more lower terminals and a cut test pattern disposed between the first conductive pattern and the second conductive pattern, the test pattern used for testing electrical characteristics of the first conductive pattern and the second conductive pattern.

10 Claims, 5 Drawing Sheets

INTERPOSER CHIP, MULTI-CHIP PACKAGE INCLUDING THE INTERPOSER CHIP, AND METHOD OF MANUFACTURING THE SAME

CROSS-RELATED APPLICATION

This application claims priority under 35 USC §119 to Korean Patent Application No. 10-2010-0081902, filed on Aug. 24, 2010 in the Korean Intellectual Property Office (KIPO), the contents of which are herein incorporated by reference in their entirety.

BACKGROUND

1. Field

Example embodiments relate to an interposer chip, a multi-chip package including the interposer chip, and a method of manufacturing the interposer chip and the multi-chip package. More particularly, example embodiments relate to an interposer chip configured to electrically connect two semiconductor chips having different sizes from each other, a multi-chip package including the interposer chip, and a method of manufacturing the interposer chip.

2. Description of the Related Art

Generally, a plurality of semiconductor fabrication processes may be performed on a semiconductor substrate to form a plurality of semiconductor chips. In order to mount the semiconductor chips on a printed circuit board (PCB), a packaging process may be performed on the semiconductor chips to form semiconductor packages.

In order to increase a storage capacity of the semiconductor package, a stacked package including sequentially stacked semiconductor packages may be used. The stacked semiconductor chips, or chips stacked on package substrate may be electrically connected with each other via conductive wires.

However, when the semiconductor chips and/or a package substrate have different sizes, it may be difficult to directly connect the stacked semiconductor chips with each other or with the package substrate using the conductive wires due to a length limit of the conductive wire. In order to electrically connect the semiconductor chips having different sizes, an interposer chip may be interposed between the semiconductor chips or between one or more semiconductor chips and a package substrate. The semiconductor chips may be indirectly connected with each other or with the package substrate via the interposer chip.

The interposer chip may include a substrate, and conductive patterns built in the substrate. The conductive patterns may be electrically connected to the semiconductor chips and/or the package substrate.

The conductive patterns may be electrically isolated from each other. Therefore, the electrically isolated conductive patterns may not be tested until the interposer chip is connected to stacked semiconductor chips. That is, in current testing methods, in order to test electrical characteristics of the conductive patterns, the conductive patterns are first connected to the semiconductor chips. Thus, when the conductive patterns are determined to be defective, the working semiconductor chips as well as the defective interposer chip may be scrapped.

SUMMARY

Example embodiments provide an interposer chip capable of being electrically tested before the interposer chip is connected to a semiconductor chip.

Example embodiments also provide a method of manufacturing the above-mentioned interposer chip.

Example embodiments further provide a multi-chip package including the above-mentioned interposer chip.

According to some example embodiments, there is provided a method of manufacturing an interposer chip. The method includes providing a substrate; forming a plurality of upper terminals at a first surface of the substrate, at least one upper terminal comprising an external connection for connecting outside the interposer chip; forming a plurality of lower terminals at a second, opposite surface of the substrate, at least one lower terminal comprising an external connection for connecting outside the interposer chip; forming, for a first upper terminal, a first conductive pattern that electrically connects the first upper terminal to a first set of one or more lower terminals; forming, for a second upper terminal, a second conductive pattern that electrically connects the second upper terminal to a second set of one or more lower terminals; forming a test pattern that electrically connects the first conductive pattern to the second conductive pattern; supplying a first current from the first conductive pattern through the test pattern to the second conductive pattern; and removing the test pattern.

According to some example embodiments, there is provided a multi-chip package. The multi-chip package includes a first semiconductor chip, an interposer chip and a second semiconductor chip. The interposer chip may be interposed between the first semiconductor chip and the second semiconductor chip to electrically connect the first semiconductor chip and the second semiconductor chip with each other. The interposer chip includes a substrate; a plurality of upper terminals at a first surface of the substrate, at least one upper terminal comprising an external connection for connecting outside the interposer chip; a plurality of lower terminals at a second surface, opposite surface of the substrate, at least one lower terminal comprising an external connection for connecting outside the interposer chip; for a first upper terminal, a first conductive pattern that electrically connects the first upper terminal to a first set of one or more lower terminals; for a second upper terminal, a second conductive pattern that electrically connects the second upper terminal to a second set of one or more lower terminals; and a cut test pattern disposed between the first conductive pattern and the second conductive pattern, the test pattern used for testing electrical characteristics of the first conductive pattern and the second conductive pattern.

According to further some example embodiments, a multi-chip package includes a package substrate, a first semiconductor chip, second semiconductor chip and an interposer chip. The first and second semiconductor chips are disposed over the package substrate. The interposer chip is disposed between the first and second semiconductor chips and the package substrate. The interposer chip includes a silicon substrate, a first conductive pattern, a second conductive pattern and a test pattern. The first and second conductive patterns are in the silicon substrate and the test pattern is disposed between the first conductive pattern and the second conductive pattern. The test pattern is used for testing electrical characteristics of the first conductive pattern and the second conductive pattern. The test pattern is cut by applying current after testing and includes a cut fuse.

BRIEF DESCRIPTION OF THE DRAWINGS

Example embodiments will be more clearly understood from the following detailed description taken in conjunction with the accompanying drawings.

FIG. 1 is a cross-sectional view illustrating an interposer chip in accordance with some example embodiments;

FIG. 2 is a flow chart illustrating a method of testing the interposer chip in FIG. 1;

FIG. 3 is a cross-sectional view illustrating an interposer chip in accordance with some example embodiments;

FIG. 4 is a flow chart illustrating a method of testing the interposer chip in FIG. 3;

FIG. 5 is a cross-sectional view illustrating an interposer chip in accordance with some example embodiments;

FIG. 6 is a flow chart illustrating a method of testing the interposer chip in FIG. 5;

FIG. 7 is a cross-sectional view illustrating a multi-chip package including the interposer chip in FIG. 1;

DETAILED DESCRIPTION OF THE EMBODIMENTS

Figure 1:
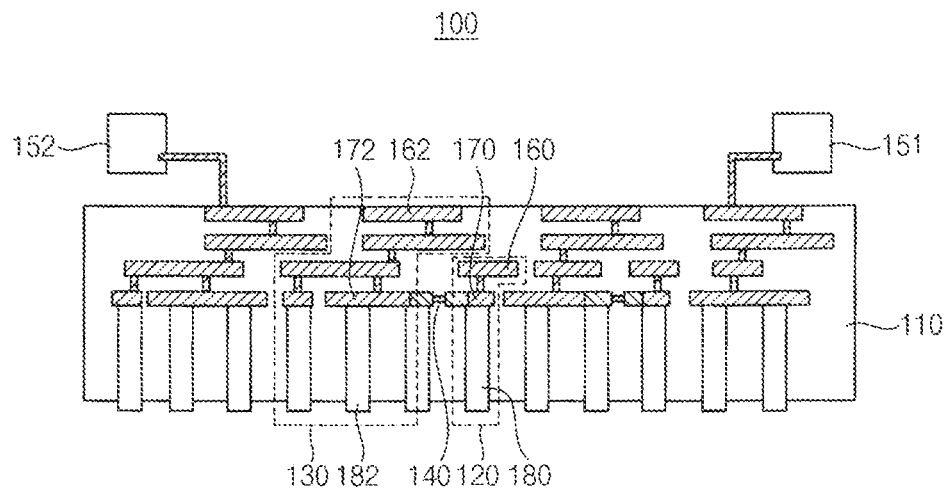
FIGS. 1 to 7 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present invention.

Also, though terms like a first, a second, and a third are used to describe various elements, regions, and layers in various embodiments, the elements, regions, and the layers are not limited to these terms. Unless indicated as otherwise, these terms are used only to discriminate one element, region, or layer from another element, region, or layer.

Terms such as "same," "planar," or "coplanar," as used herein when referring to orientation, location, shapes, sizes, amounts, or other measures do not necessarily mean an exactly identical orientation, location, shape, size, amount, or other measure, but are intended to encompass nearly identical orientation, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a cross-sectional view illustrating an interposer chip in accordance with some example embodiments.

Referring to FIG. 1, an interposer chip 100 of this example embodiment may include a substrate 110, a first conductive pattern 120, a second conductive pattern 130, a test pattern 140, a first upper terminal 160 of the first conductive pattern 120, a second upper terminal 162 of the second conductive pattern 130, a first lower terminal 170 of the first conductive pattern 120, a second lower terminal 172 of the second conductive pattern 130, a first external connection terminal 180 of the first conductive pattern 120 and a second external connection terminal 182 of the second conductive pattern 130. In one embodiment, the interposer chip 100 does not include logic or storage circuitry, but only includes conductive patterns for passing signals between chips or substrates disposed on the interposer chip 100.

In one embodiment, the substrate 110 may have a rectangular plate shape. In some example embodiments, the substrate 110 is an insulating substrate, silicon substrate, or gallium-arsenic substrate, etc. When the substrate 110 is an insulating substrate, the substrate 110 may include oxide. The substrate 110 may be interposed between semiconductor chips having different sizes in order to electrically connect the semiconductor chips, and may serve as a redistribution layer. In other embodiments, described further below, the substrate 110 is interposed between a chip and a semiconductor package substrate. The substrate 110 may be referred to herein as an interposer chip.

The first conductive pattern 120 may be built in the substrate 110. The second conductive pattern 130 may be built in the substrate 110. In one embodiment, each conductive pattern includes an upper terminal, a lower terminal, and an external connection terminal. For example, first conductive pattern 120 may include a first upper terminal 160, a first lower terminal 170, and a first external connection terminal 180. Second conductive pattern 130 may include a second upper terminal 162, a second lower terminal 172, and a second external connection terminal 182.

In certain embodiments, one or more upper terminals (e.g., 162 in FIG. 1) are disposed at an upper surface of substrate 110 and serve as external connections for the substrate 110, for example, to connect to terminals on a semiconductor chip or package disposed on the top surface of substrate 110. As such, these upper terminals may function as connection pads, and may be referred to herein as upper external connection terminals. The lower terminals (e.g., 170 and 172) may be disposed internally within the substrate 110, and may connect to and contact external connection terminals 180 and 182, which in one embodiment are through-substrate vias that extend beyond a lower surface of substrate 110. As such, the external connection terminals 180 and 182 may be referred to herein as lower external connection terminals, and the lower terminals 170 and 172 may be referred to herein as lower internal terminals. Each of terminals 160, 162, 170, 172, 180, and 182 may be formed of a conductive material, such as a metal or polysilicon, such that they electrically connect to each other. Between upper terminals 162 and 160 and respective lower terminals 172 and 170, there may be additional conductive materials formed in layers, and/or as through vias, that form the conductive patterns 120 and 130.

In one embodiment, the first conductive pattern 120 and the second conductive pattern 130 may be independently connected to pads of a plurality of semiconductor chips (e.g., through upper terminals and/or external connection terminals). Thus, the first conductive pattern 120 and the second conductive pattern 130 may be electrically isolated from each other.

In one embodiment, the test pattern 140 is electrically connected between the first conductive pattern 120 and the second conductive pattern 130. For example, as shown in FIG. 1, a test pattern 140 is connected between a first lower terminal 170 of the first conductive pattern 120 and a second lower terminal 172 of the second conductive pattern 130. However, the test pattern 140, as discussed further below, may be disposed at other locations to connect the first conductive pattern 120 and second conductive pattern 130.

In some example embodiments, the test pattern 140 may include an e-fuse. The e-fuse may, for example, be a metal fuse or poly fuse and may connect with a transistor. For example, in one embodiment, a source of the transistor is connected to the first conductive pattern 120, a drain of the transistor is connected to a first node of the e-fuse and a second node of the e-fuse is connected to the second conductive pattern 130. The gate electrode of the transistor may connect to an external node of the interposer chip to turn-on the transistor. In one embodiment, the e-fuse may have a narrower width than the portion of the first conductive pattern 120 or the second conductive pattern 130 that it contacts (e.g., it may be narrower than first lower terminal 170 and/or second lower terminal 172). When a cutting current is supplied to the e-fuse 140 in a short period of time, the e-fuse 140 may be cut. The e-fuse 140 may be connected between a lower terminal of the first conductive pattern 120 (e.g., first lower terminal 170) and a lower terminal of the second conductive pattern 130 (e.g., second lower terminal 172). In some other embodiments, however, the e-fuse 140 may be connected between an upper terminal of the first conductive pattern 120 and an upper terminal of the second conductive pattern 130.

In one embodiment, when a test current is supplied to the first conductive pattern 120, for example through the first external connection terminal 180, the test current flows from the external connection terminal 180, through the first conductive pattern 120 (e.g., via the first lower terminal 170), the test pattern 140 (e.g., e-fuse), and the second conductive pattern 130 (e.g., via the second lower terminal 172). The test current may be detected from the external connection terminal 182, which is part of the second conductive pattern 130 and is electrically connected to the second lower terminal 172. Whether the first conductive pattern 120 and the second conductive pattern 130 are properly functioning or are defective is determined based on the detected test current.

As described above, in one embodiment, the external connection terminals 180 and 182 may comprise through-substrate vias (e.g., through-silicon vias). A conductive material (e.g., metal and/or polysilicon) may fill in the through-substrate vias 180 and 182 to connect to and contact the first lower terminal 170 and second lower terminal 172 respectively. The conductive material in the through-substrate vias 180 and 182 may be referred to herein as a plug. In some example embodiments, the e-fuse 140 may be connected between the first conductive pattern 120 and the second conductive pattern 130 above the through-substrate vias 180 and 182, and at a same height as the first lower terminal 170 and second lower terminal 172.

According to this example embodiment, the first and second conductive patterns of the interposer chip may be electrically connected with each other via the e-fuse. Thus, the first and second conductive patterns may be tested prior to attaching the substrate 110 to other semiconductor chips. Although exemplary test patterns are shown in FIG. 1 and the other figures, these are shown as an example only, and test patterns may be formed between other or additional conductive patterns within substrate 110 for testing purposes.

Figure 2:
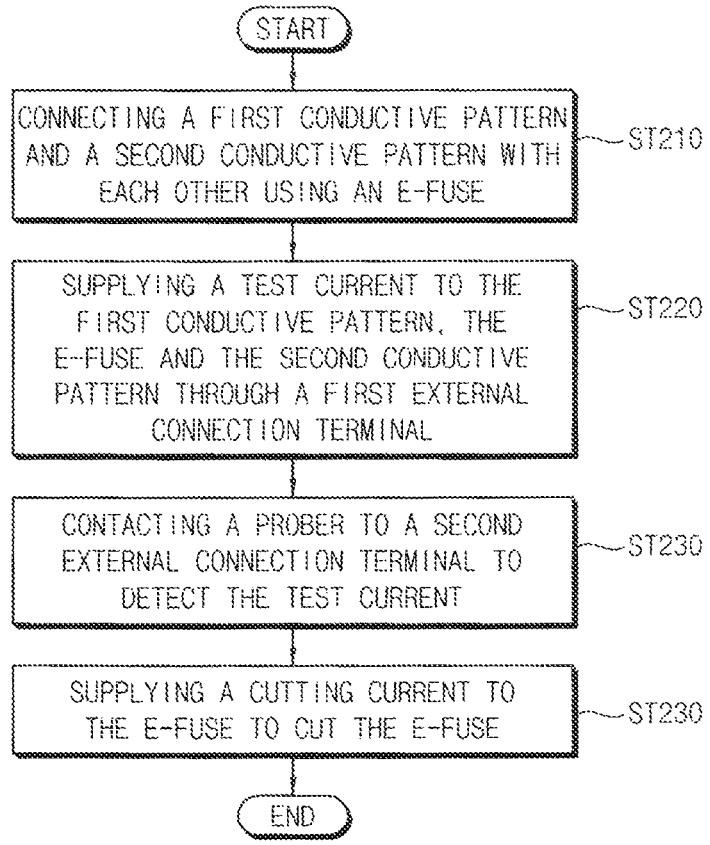

FIG. 2 is a flow chart illustrating an exemplary method of testing the interposer chip in FIG. 1.

Referring to FIG. 2, in step ST210, the first conductive pattern 120 and the second conductive pattern 130 may be electrically connected to each other using a test pattern 140, such as an e-fuse.

In step ST220, the test current may be supplied to the first conductive pattern 120, via, for example, first external connection terminal 180. For example, a probe that supplies a test current may contact the first external connection terminal 180. The test current may flow from the first external connection terminal 180 to the second external connection terminal 182 through the first conductive pattern 120, the e-fuse and the second conductive pattern 130.

In step ST230, a probe may make contact with the second external connection terminal 182 to detect the test current. Whether the first conductive pattern 120 and the second conductive pattern 130 are properly formed or not (e.g., whether the internal connections are all connected and whether there are no short circuits) may be determined based on the detected test current.

In step ST240, after completing the test of the interposer chip 100, the cutting current may be supplied to the e-fuse in a short period of time to cut the e-fuse. Thus, the first conductive pattern 120 and the second conductive pattern 130 may be electrically isolated from each other.

Exemplary probes 151 and 152 are depicted in FIG. 1. These probes are shown as connected to upper terminals of the substrate 110. As such, in addition to the probes discussed above, in which probes contact lower external connection terminals 180 and 182 and may be used to test, for example, whether the lower external connection terminals 180 and 182 are formed properly, in certain embodiments probes can be used to contact upper terminals of the substrate to determine whether certain conductive patterns are properly formed. In one embodiment, when fuses such as shown in FIG. 1 are used, then probes may be used at upper terminals at an upper surface of substrate 110 to test whether internal portions of conductive patterns are formed properly, and probes may be used at lower terminals at a lower surface of the substrate 110 to test whether lower external connection terminals, such as through-substrate vias are properly formed.

Figure 3:
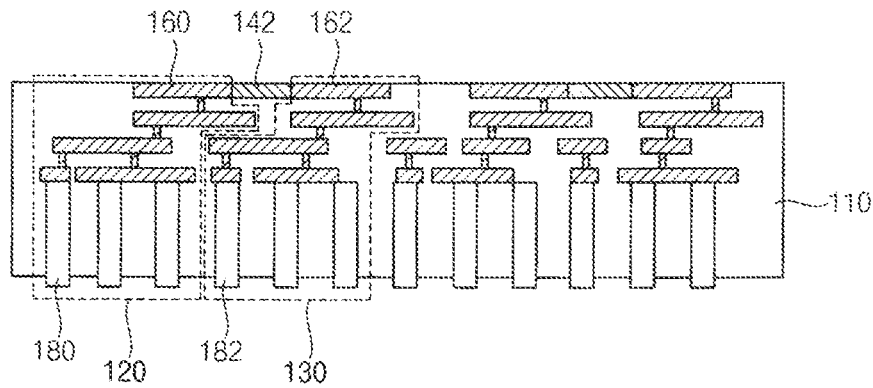

FIG. 3 is a cross-sectional view illustrating an interposer chip in accordance with some example embodiments.

An interposer chip 100a of this example embodiment may include elements substantially the same as those of the interposer chip 100 in FIG. 1 except for a test pattern. Thus, the same reference numerals refer to the same elements and any further illustrations with respect to the same elements are omitted herein for brevity.

Referring to FIG. 3, a test pattern of the interposer chip 100a in accordance with this example embodiment may include a conductive line, such as a metal line 142. The metal line 142 may be electrically connected between the first conductive pattern 120 and the second conductive pattern 130. In some example embodiments, the metal line 142 may be connected between an upper terminal 160 of the first conductive pattern 120 and an upper terminal 162 of the second conductive pattern 130, and may be disposed at a top surface of interposer chip 100a.

Figure 4:
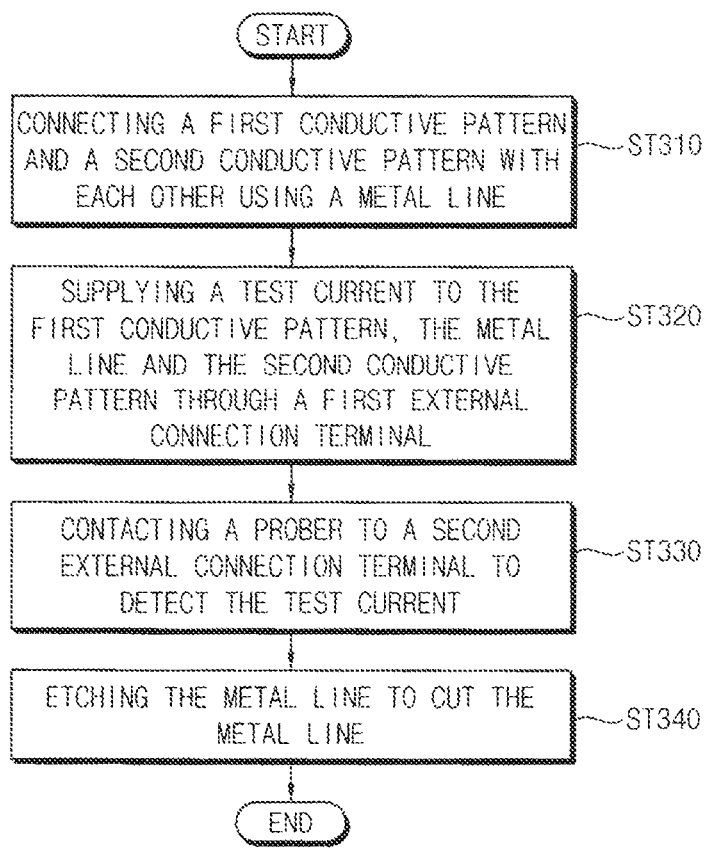

FIG. 4 is a flow chart illustrating an exemplary method of testing the interposer chip in FIG. 3.

Referring to FIG. 4, in step ST310, the first conductive pattern 120 and the second conductive pattern 130 may be electrically connected with each other using the metal line 142.

In step ST320, the test current may be supplied to a first external connection terminal 180. For example, a probe that supplies a test current may contact the first external connection terminal 180. The test current may flow from the first external connection terminal 180 to a second external connection terminal 182 through the first conductive pattern 120, the metal line 142 and the second conductive pattern 130.

In step ST330, a probe may contact the second external connection terminal 182 to detect the test current. Whether the first conductive pattern 120 and the second conductive pattern 130 are properly formed or not may be determined based on the detected test current.

In step ST340, after completing the test of the interposer chip 100a, the metal line 142 may be removed, for example by etching to cut the metal line 142. Thus, the first conductive pattern 120 and the second conductive pattern 130 are electrically isolated from each other.

Figure 5:
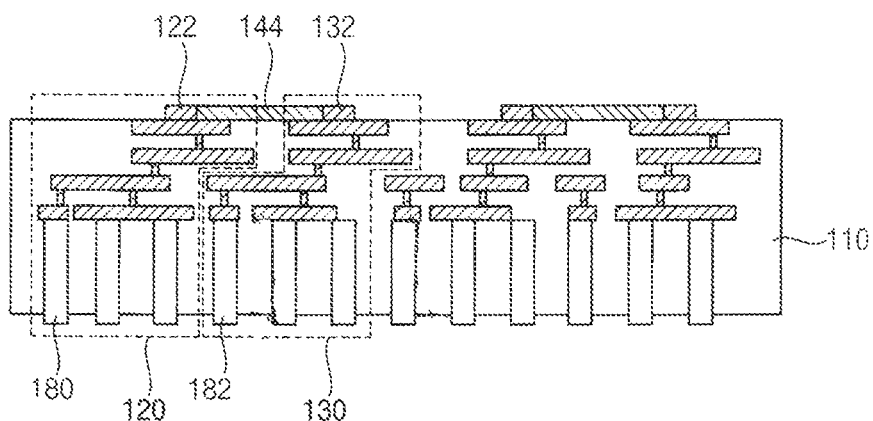

FIG. 5 is a cross-sectional view illustrating an interposer chip in accordance with another example embodiment.

An interposer chip 100b of this example embodiment may include elements substantially the same as those of the interposer chip 100 in FIG. 1 except for further including conductive bumps and a test pattern 144. Thus, the same reference numerals refer to the same elements and any further illustrations with respect to the same elements are omitted herein for brevity.

Referring to FIG. 5, a first conductive bump 122 (e.g., solder bump or solder ball) may be formed on the first conductive pattern 120. A second conductive bump 132 may be formed on the second conductive pattern 130. The first conductive bump 122 and the second conductive bump 132 may be electrically connected to pads of semiconductor chips (not shown).

In some example embodiments, the test pattern may include a conductive line, such as a metal line 144. The metal line 144 may be electrically connected between the first conductive bump 122 and the second conductive bump 132, and may be disposed above the surface of the interposer chip 100b. The metal line 144 may be cut by an etching process.

Figure 6:
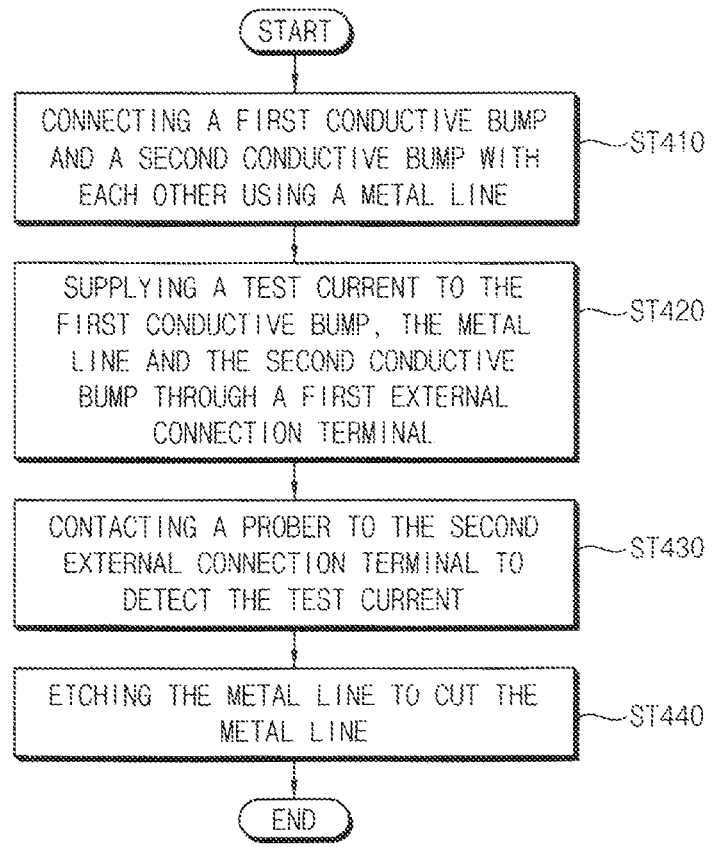

FIG. 6 is a flow chart illustrating a method of testing the interposer chip in FIG. 5.

Referring to FIG. 6, in step ST410, the first conductive bump 122 and the second conductive bump 132 may be electrically connected with each other using the metal line 144.

In step ST420, the test current may be supplied to the first external connection terminal 180. For example, a probe that supplies a test current may contact the first external connection terminal 180. The test current may flow from the first external connection terminal 180 to the second external connection terminal 182 through the first conductive pattern 120, the first conductive bump 122, the metal line 144, the second conductive bump 132 and the second conductive pattern 130.

In step ST430, a probe may contact the second external connection terminal 182 to detect the test current. Whether the first conductive pattern 120 and the second conductive pattern 130 may be properly formed or not may be determined based on the detected test current.

In step ST440, after completing the test of the interposer chip 100b, the metal line 144 may be removed (e.g. by etching) to cut the metal line 144. Thus, the first conductive pattern 120 and the second conductive pattern 130 are electrically isolated from each other.

Figure 7:
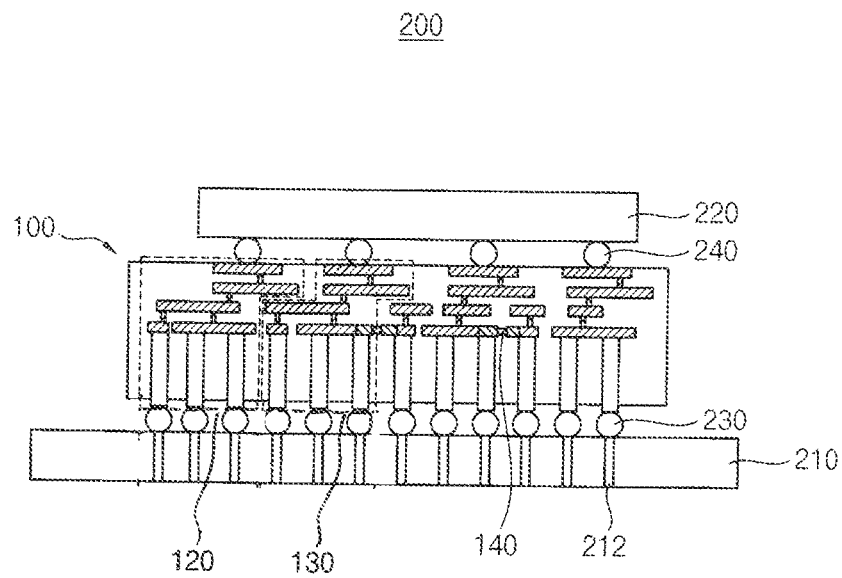

FIG. 7 is a cross-sectional view illustrating a multi-chip package including the interposer chip in FIG. 1.

Referring to FIG. 7, a multi-chip package 200 may include a first semiconductor chip 210, an interposer chip 100 and a second semiconductor chip 220. In some example embodiments, the interposer chip 100 of this example embodiment may include elements substantially the same as those of the interposer chip 100 in FIG. 1. Thus, the same reference numerals refer to the same elements and any further illustrations with respect to the same elements are omitted herein for brevity.

In one embodiment, the first semiconductor chip 210 may be arranged under the interposer chip 100. Additionally, the first semiconductor chip 210 may be attached to a package substrate (not shown). The first semiconductor chip 210 may have first plugs 212. Each of the first plugs 212 may be formed through a first through-substrate via in the first semiconductor chip 210 in a vertical direction. In some example embodiments, the first plugs 212 may be electrically connected between pads of the package substrate (not shown) and first conductive bumps 230.

The interposer chip 100 may be attached on an upper surface of the first semiconductor chip 210. The interposer chip 100 may have a size smaller than that of the first semiconductor chip 210 (e.g., to have a smaller area). First conductive bumps 230 may be interposed between the interposer chip 100 and the first semiconductor chip 210. In some example embodiments, the first conductive pattern 120 and the second conductive pattern 130 of the interposer chip 100 may be electrically connected to the first plugs 212 of the first semiconductor chip 210 via the first conductive bumps 230. In one embodiment, the interposer chip 100 may be previously tested, using, for example, one of the testing methods described previously. Thus, the test pattern 140 may be cut (e.g., a cut fuse), so that the first conductive pattern 120 and the second conductive pattern 130 may be electrically isolated from each other.

The second semiconductor chip 220 may be attached on an upper surface of the interposer chip 100. In one embodiment, the interposer chip may have a size greater than that of the second semiconductor chip 220 (i.e., to have a larger area). Second conductive bumps 240 may be interposed between the interposer chip 100 and the second semiconductor chip 220. In some example embodiments, the first semiconductor chip 210 is electrically connected to the second semiconductor chip 220 through the first conductive pattern 120 or the second conductive pattern 130 of the interposer chip 100 via the first conductive bumps 230 and the second conductive bumps 240, respectively.

In some example embodiments, because the test patterns 140 have been cut, a current applied to the second semiconductor chip 220 may flow to the first plugs 212 of the first semiconductor chip 210 through the second conductive bumps 240, one of the first conductive pattern 120 or the second conductive pattern 130 of the interposer chip 100, and the first conductive bumps 230. That is, the current may not flow through the test pattern 140.

In some example embodiments, the multi-chip package 200 may include the interposer chip 100a in FIG. 3 or the interposer chip 100b in FIG. 5 in place of the interposer chip 100 in FIG. 1. As such, the multi-chip package 200 may include an etched test pattern that was used for testing but that no longer connects first and second conductive patterns.

Figure 8:
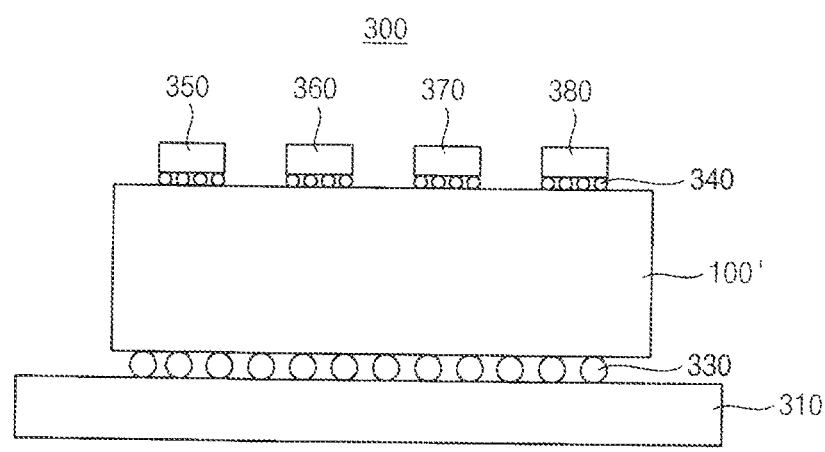
FIG. 8 is another cross-sectional view illustrating a multi-chip package including an example interposer chip, according to one embodiment.

FIG. 8 is another cross-sectional view illustrating a multi-chip package including an example interposer chip.

Referring to FIG. 8, a multi-chip package 300 may include a package substrate 310, an interposer chip 100' and a plurality of semiconductor chips 350, 360, 370 and 380. In some example embodiments, the interposer chip 100' of this example embodiment may include elements substantially the same as one of the interposer chip 100, 100a and 100b in FIG. 1, FIG. 3 and FIG. 5, respectively, for connecting between chips 350, 360, 370, and 380 and package substrate 310. As such, the interconnections between the chips 350, 360, 370, and 380 and the package substrate 310 are not shown. As shown in the embodiment shown in FIG. 8, the plurality of semiconductor chips 350, 360, 370 and 380 may be arranged at the same level above the interposer chip 100'. In addition, one or more of the plurality of semiconductor chips 350, 360, 370, and 380 may alternatively be multi-chip packages. Also, the chips 350, 360, 370 and 380 may comprise memory chips, logic chips or a combination of memory chips and logic chips. The package substrate 310 may include a plurality of through-substrate vias (not shown). Additionally, the package substrate 310 may include a plurality of solder balls for connecting to a mother board (not shown).

Figure 9:
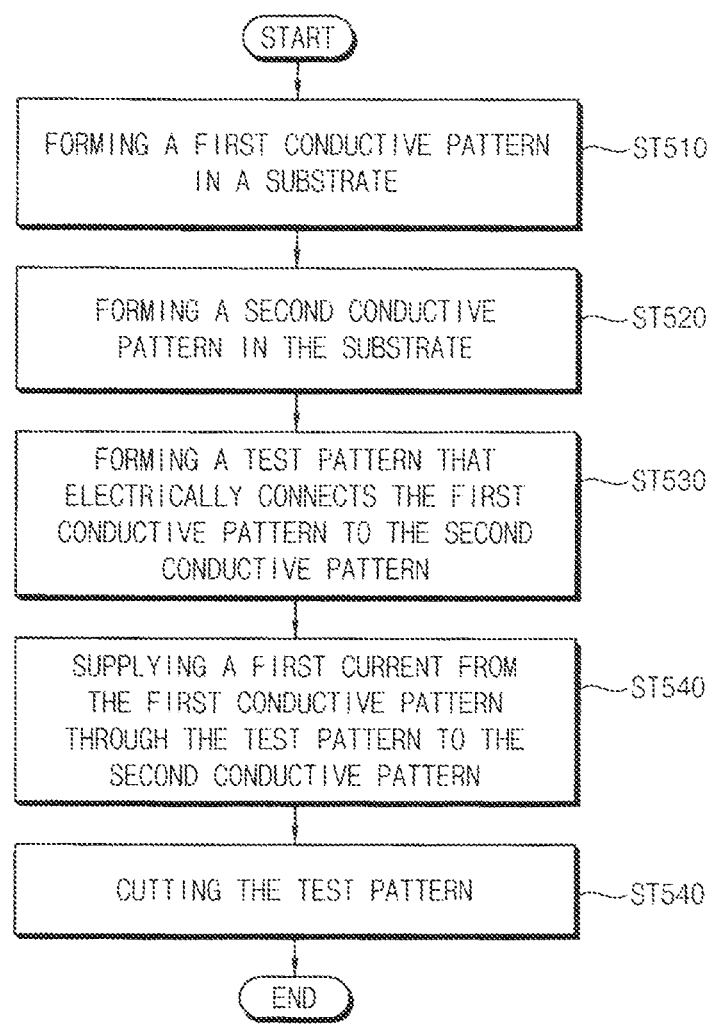
FIG. 9 is a flow chart illustrating a method of manufacturing an interposer chip for a multi-chip package, according to one embodiment.

FIG. 9 is a flow chart illustrating a method of manufacturing an interposer chip as shown in FIG. 8 for a multi-chip package.

Referring to FIG. 9, in step ST510, one or more first conductive patterns with first upper terminals and first lower terminals are formed in a substrate. For example, a plurality of first conductive patterns may be formed in regions to be placed beneath each semiconductor chip 350, 360, 370, and 380. Each first conductive pattern is electrically connected between a first upper terminal for connecting to a chip and a first lower terminal for connecting to the substrate, such as a package substrate.

In step ST520, one or more second conductive patterns with a second upper terminals and second lower terminals are formed in the substrate. For example, a plurality of second conductive patterns may be formed in regions to be placed beneath each semiconductor chip 350, 360, 370, and 380. Each second conductive pattern is electrically connected between a second upper terminal for connecting to the chip and a second lower terminal for connecting to the substrate.

In step ST530, a test pattern is formed in the substrate. The test pattern is electrically connected to a first conductive pattern and a second conductive pattern.

In step ST540, a first current is supplied from the first conductive pattern through the test pattern to the second conductive pattern. When the current between the first conductive pattern and second conductive pattern is detected, the first and second conductive patterns may be determined to be properly formed.

In step ST550, the test pattern is cut to isolate the first conductive pattern and second conductive pattern from each other. The method of cutting may include, for example, removing the test pattern by an etching process or cutting the test pattern by current flow. After forming the interposer chip, the interposer chip may be stacked on and connected to a substrate, such as substrate 310, and a plurality of chips, such as chips 350, 360, 370, and 380, may be stacked on and connected to the interposer chip to form a semiconductor package.

According to these example embodiments, the conductive patterns of the interposer chip may be electrically connected to each other via the test pattern. Thus, the interposer chip may be tested without connecting the conductive patterns of the interposer chip and a semiconductor chip to each other. As a result, when the conductive pattern is defective, only the interposer chip may be scrapped, not the properly functioning semiconductor chip.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing an interposer chip, the method comprising:
    providing a substrate;
    forming a plurality of upper terminals at a first surface of the substrate, at least one upper terminal comprising an external connection for connecting outside the interposer chip;
    forming a plurality of lower terminals at a second, opposite surface of the substrate, at least one lower terminal comprising an external connection for connecting outside the interposer chip;
    forming, for a first upper terminal, a first conductive pattern that electrically connects the first upper terminal to a first set of one or more lower terminals;
    forming, for a second upper terminal, a second conductive pattern that electrically connects the second upper terminal to a second set of one or more lower terminals;
    forming a test pattern that electrically connects the first conductive pattern to the second conductive pattern;
    supplying a first current from the first conductive pattern through the test pattern to the second conductive pattern; and
    cutting the test pattern.

2. The method of claim 1, wherein the test pattern includes a conductive material, and cutting the test pattern comprises:
    removing the test pattern by etching the conductive material.

3. The method of claim 2, wherein the conductive material is a metal.

4. The method of claim 2, wherein:
    the plurality of upper terminals are disposed at a first height within the substrate; and
    the test pattern is disposed at the first height between the first upper terminal and the second upper terminal.

5. The method of claim 1, wherein the test pattern includes a conductive material, and cutting the test pattern comprises:
    electrically disconnecting the test pattern between the first conductive pattern and the second conductive pattern,
    wherein electrically disconnecting includes electrically cutting a fuse.

6. The method of claim 1, wherein the first conductive pattern and second conductive pattern includes one or more through-substrate via patterns.

7. The method of claim 6, wherein the substrate is an insulating layer.

8. The method of claim 7, wherein cutting the test pattern comprises cutting an e-fuse by supplying a second current through the first and second conductive patterns, wherein the second current is greater than the first current.

9. A method of manufacturing a multi-chip package including a first semiconductor chip, a second semiconductor chip and a package substrate, the method comprising:
    providing the interposer chip of claim 6; and
    electrically connecting each of the first semiconductor chip and the second semiconductor chip to the package substrate through the interposer chip.

10. The method of claim 9, wherein the test pattern comprises:
    a transistor having a first node, a second node and a gate electrode, the first node contacting the first conductive pattern;
    a fuse having a third node and a fourth node, the third node contacting the second node of the transistor and the fourth node contacting the second conductive pattern.

* * * * *